(12) United States Patent
Bonitz et al.

(10) Patent No.: US 6,984,286 B2
(45) Date of Patent: Jan. 10, 2006

(54) ADJUSTING FILLET GEOMETRY TO COUPLE A HEAT SPREADER TO A CHIP CARRIER

(75) Inventors: Barry A. Bonitz, Endwell, NY (US); Eric Duchesne, Granby (CA); Michael A. Gaynes, Vestal, NY (US); Eric A. Johnson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 10/338,963

(22) Filed: Jan. 8, 2003

(65) Prior Publication Data

US 2003/0101582 A1 Jun. 5, 2003

Related U.S. Application Data

(62) Division of application No. 09/764,048, filed on Jan. 17, 2001, now Pat. No. 6,545,869.

(51) Int. Cl.
*B32B 31/20* (2006.01)

(52) U.S. Cl. .............................. 156/275.5; 156/275.7; 156/295

(58) Field of Classification Search ................ 156/295, 156/272.2, 275.5, 275.7; 257/706, 707, 712, 257/713; 361/709; 29/832, 855; 438/118, 438/122, 126
See application file for complete search history.

(56) References Cited

U.S. PATENT DOCUMENTS

| | | | |
|---|---|---|---|
| 5,150,197 A | 9/1992 | Hamburgen | |
| 5,218,234 A | 6/1993 | Thompson et al. | |
| 5,450,283 A | 9/1995 | Lin et al. | |
| 5,510,452 A * | 4/1996 | Santhanam | 528/291 |
| 5,744,863 A | 4/1998 | Culnane et al. | |
| 5,866,953 A | 2/1999 | Akram et al. | |
| 5,898,224 A | 4/1999 | Akram | |
| 6,127,724 A | 10/2000 | DiStefano | |
| 6,214,460 B1 | 4/2001 | Bluem et al. | |
| 6,331,446 B1 | 12/2001 | Cook et al. | |
| 6,333,551 B1 | 12/2001 | Caletka et al. | |
| 6,351,032 B1 | 2/2002 | Lee et al. | |

FOREIGN PATENT DOCUMENTS

| | | |
|---|---|---|
| EP | 865094 A2 | 9/1998 |
| JP | 403228355 | 10/1991 |
| JP | 70015206 | 1/1995 |
| JP | 411031761 | 2/1999 |

* cited by examiner

*Primary Examiner*—John T. Haran
(74) *Attorney, Agent, or Firm*—Schmeiser, Olsen & Watts; William H. Steinberg

(57) ABSTRACT

An electronic structure, and associated method of fabrication, for coupling a heat spreader above a chip to a chip carrier below the chip. Initially provided is a substrate, a chip on a surface of the substrate and coupled to the substrate, and the heat spreader. Then a fillet of at least one adhesive material is formed on the chip and around a periphery of the chip. Additionally, the heat spreader is placed on a portion of the fillet and over a top surface of the chip. The fillet couples the heat spreader to the substrate. An outer surface of the fillet makes a contact angle of about 25 degrees with the surface of the substrate. The small contact angle not exceeding about 25 degrees prevents cracking of the substrate that would otherwise result from thermal cycling.

27 Claims, 9 Drawing Sheets

US 6,984,286 B2

ADJUSTING FILLET GEOMETRY TO COUPLE A HEAT SPREADER TO A CHIP CARRIER

This application is a divisional of Ser. No. 09/764,048; filed on Jan. 17, 2001 now U.S. Pat. No. 6,547,869.

BACKGROUND OF THE INVENTION

1. Technical Field

The present invention relates to an electronic structure, and associated method of fabrication, for coupling a heat spreader above a chip to a chip carrier below the chip.

2. Related Art

A chip on a chip carrier may have a heat spreader on a top surface of the chip, such that the heat spreader is directly coupled to the chip carrier by an adhesive material that encapsulates the chip. If the heat spreader and the chip carrier have about a same coefficient of thermal expansion (CTE), then the adhesive material helps keep the chip carrier-chip-heat spreader structure approximately flat during thermal cycling. Nonetheless, cracking resulting from thermal cycling has been observed to occur at the surface of the chip carrier where a bounding surface of the adhesive material contacts the chip carrier. The cracking can propagate into the chip carrier and damage circuit lines within the chip carrier.

A method and structure is needed for preventing said damage to said circuit lines within the chip carrier.

SUMMARY OF THE INVENTION

The present invention provides a method for forming an electronic structure, comprising the steps of:

providing a substrate, a chip on a surface of the substrate and coupled to the substrate, and a thermally conductive member;

forming a fillet of at least one adhesive material on the chip and around a periphery of the chip and placing the thermally conductive member on a portion of the fillet and over a top surface of the chip, wherein the at least one adhesive material is uncured, wherein the fillet couples the thermally conductive member to the substrate, and wherein an outer surface of the fillet meets the surface of the substrate at a contact curve and makes an average contact angle $\theta_{1AVE}$ with the surface of the substrate; and curing the at least one adhesive material after which the outer surface of the fillet makes an average contact angle $\theta_{2AVE}$ with the surface of the substrate such that $\theta_{2AVE}$ does not exceed about 25 degrees.

The present invention provides an electronic structure, comprising:

a substrate;

a chip on a surface of the substrate and coupled to the substrate;

a fillet of at least one adhesive material on the chip and around a periphery of the chip, wherein an outer surface of the fillet meets the surface of the substrate at a contact curve and makes an average contact angle $\theta_{AVE}$ with the surface of the substrate, and wherein $\theta_{AVE}$ does not exceed about 25 degrees; and a thermally conductive member on a portion of the fillet and over a top surface of the chip, wherein the fillet couples the thermally conductive member to the substrate.

The present invention method and structure for coupling a heat spreader above a chip to a chip carrier below the chip in a manner that prevents damage to circuit lines within the chip carrier during thermal cycling operations.

DETAILED DESCRIPTION OF THE INVENTION

Figure 1:
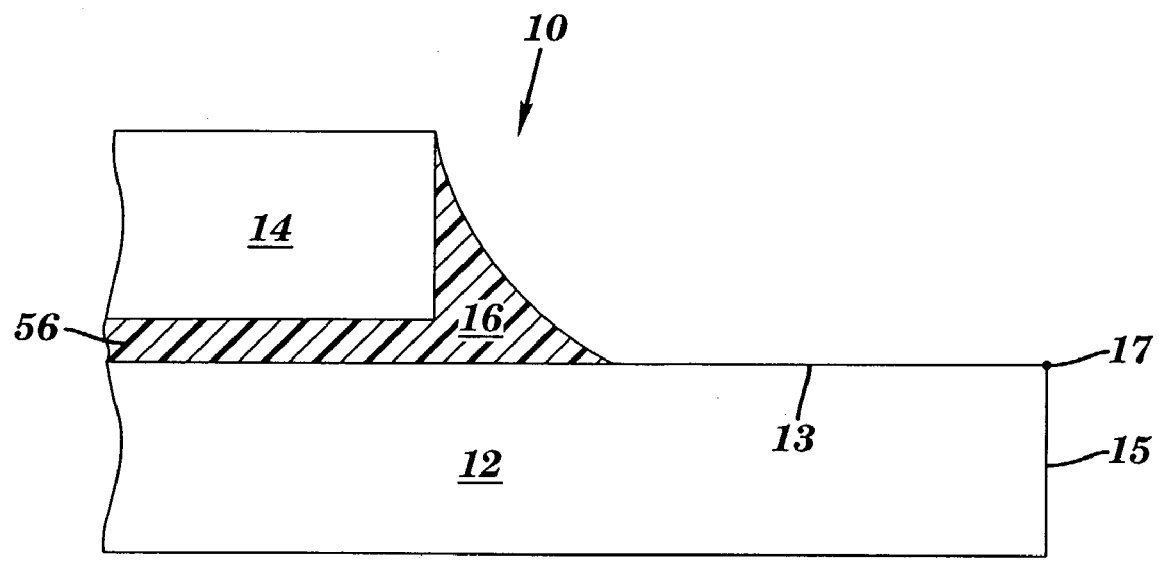
FIG. 1 depicts a front cross-sectional view of an electronic structure having a chip on a surface of a substrate, in accordance with embodiments of the present invention.
Figure 11:
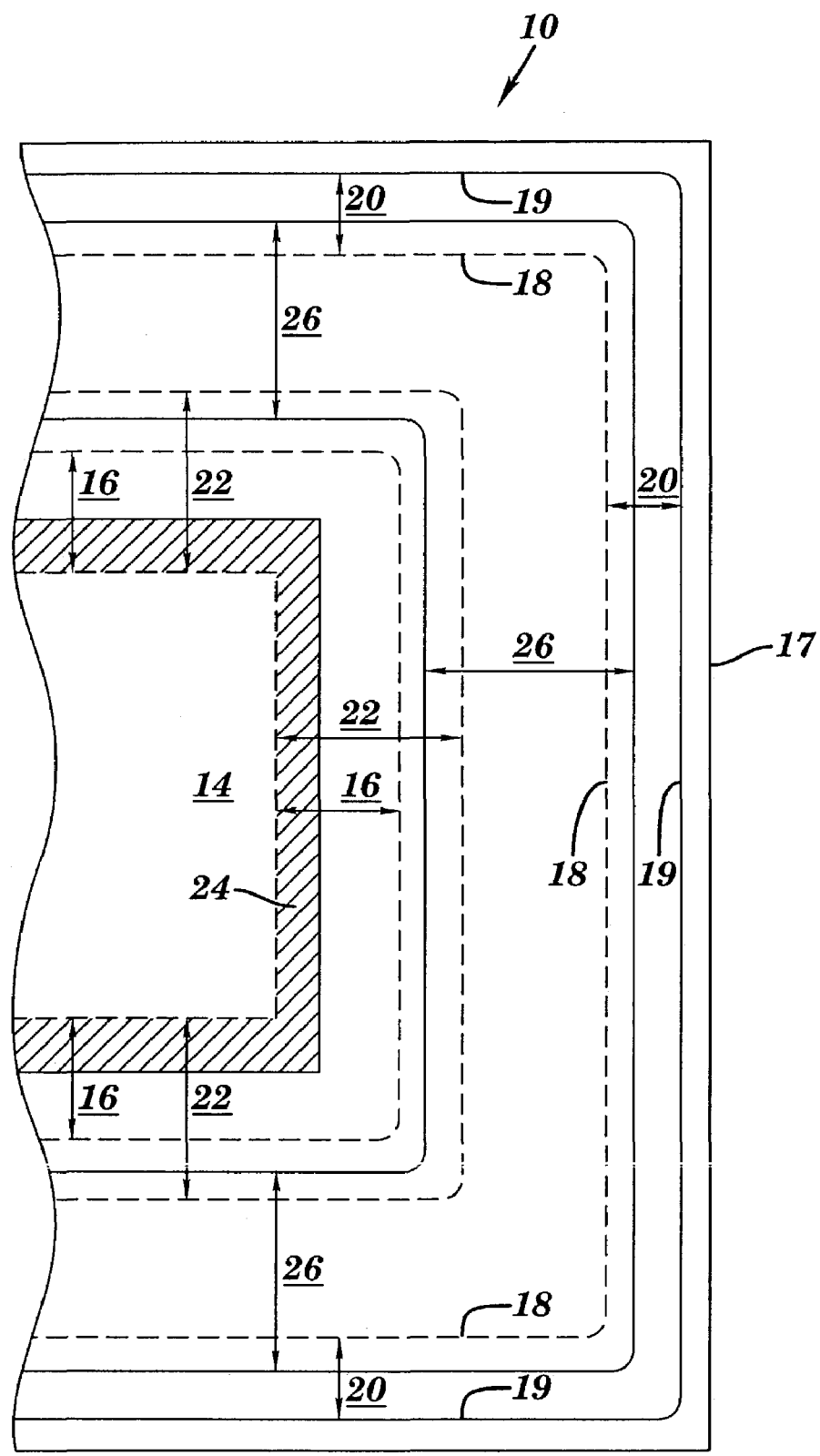
FIG. 11 depicts a top view of the electronic structure of FIG. 5.
Figure 12:
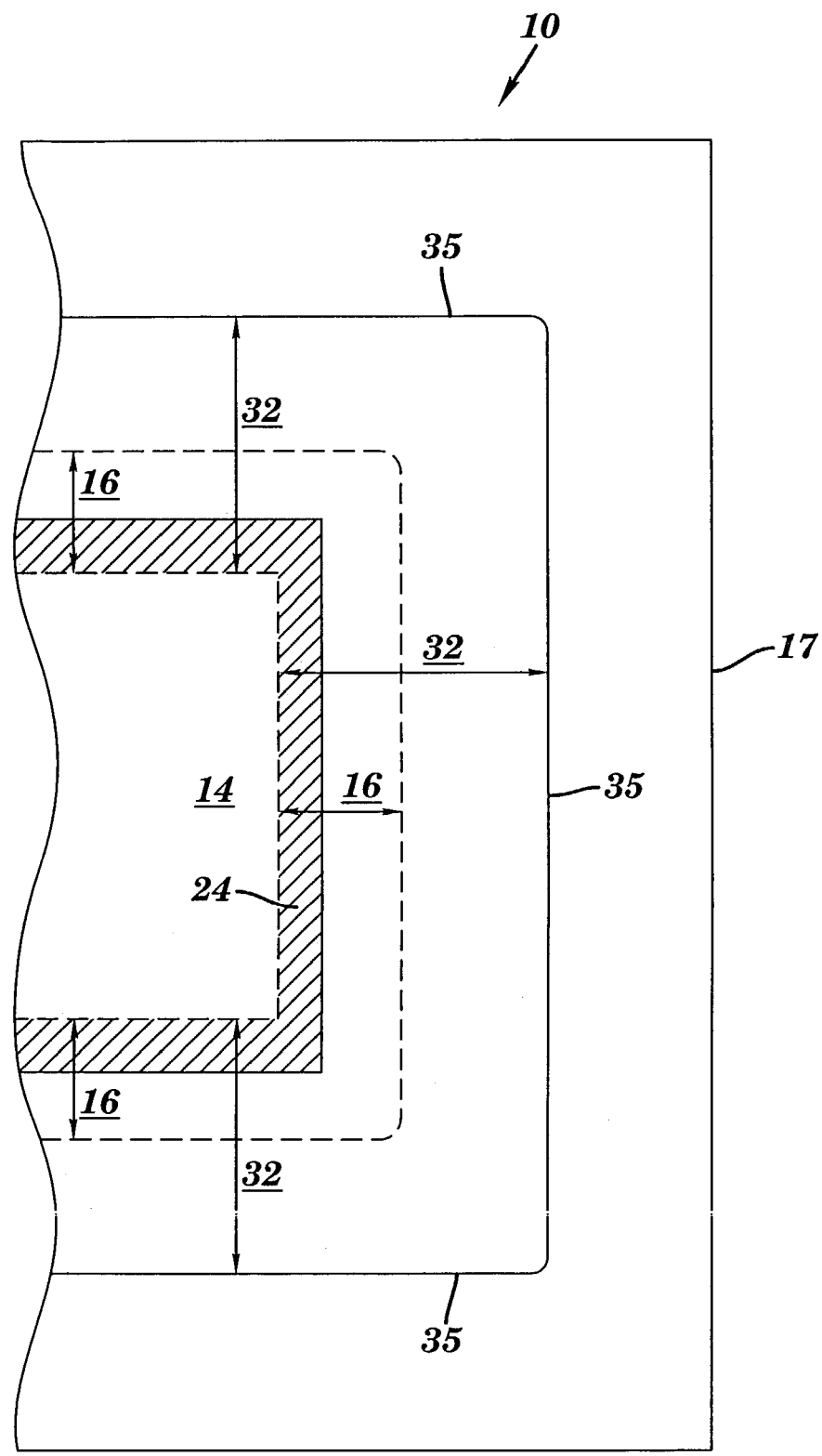
FIG. 12 depicts a top view of the electronic structure of FIG. 6.
Figure 13:
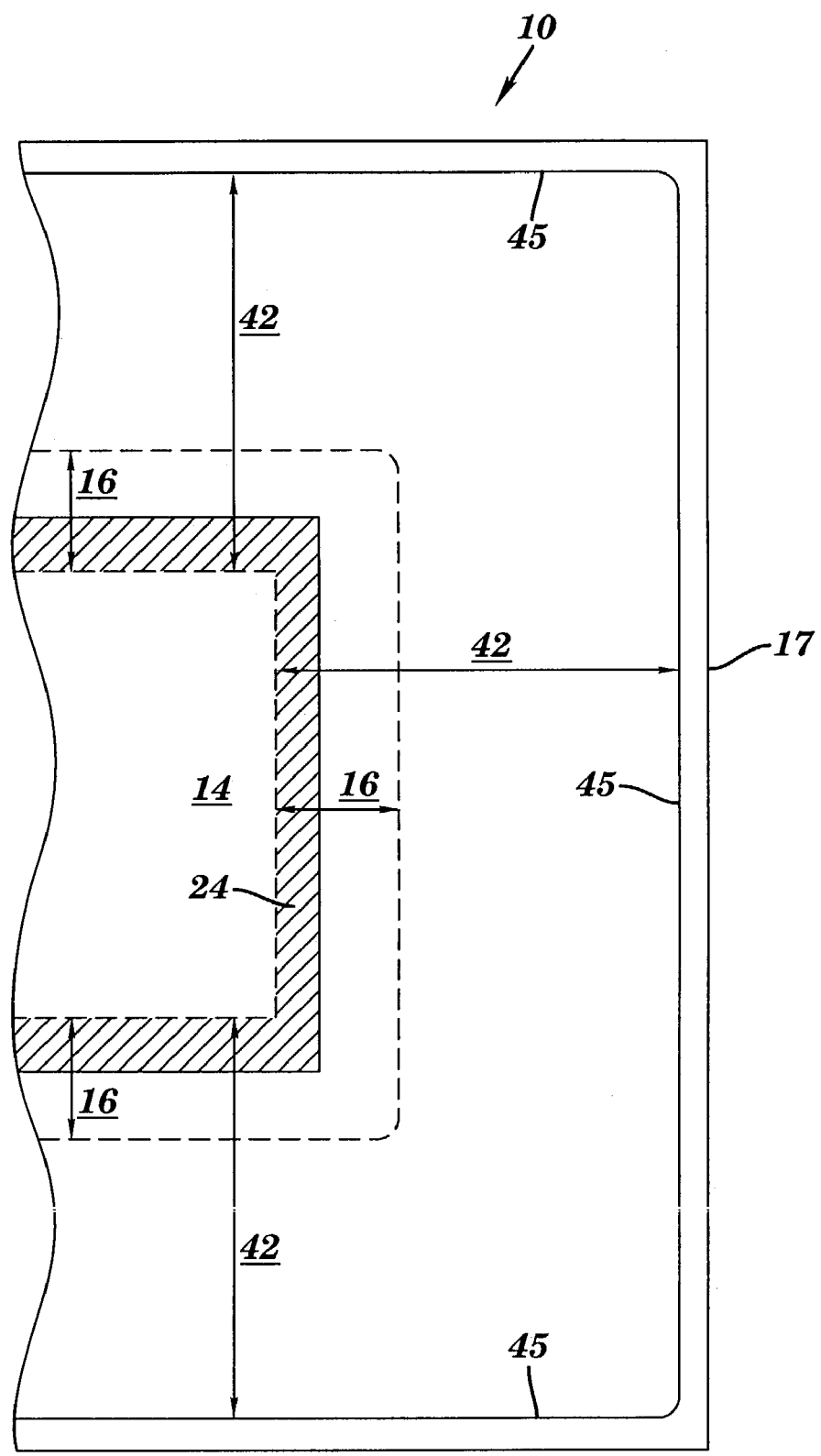
FIG. 13 depicts a top view of the electronic structure of FIG. 9.

FIG. 1 illustrates a front cross-sectional view of an electronic structure 10 having a chip 14 over a substrate 12, in accordance with embodiments of the present invention. An underfill 16 is disposed between the chip 14 and the substrate 12, and the underfill 16 encapsulates a peripheral portion of the chip 14. The underfill 16 accommodates strain induced during thermal cycling due to a differential coefficient of thermal expansion (CTE) between the chip 14 and substrate 12. The substrate 12, which may comprise a chip carrier, includes a top surface 13, a peripheral surface 15, and a peripheral edge 17. See FIGS. 11, 12, and 13, each described infra, for top views depicting the chip 14, the underfill 16, and the peripheral edge 17. Note the FIGS. 11, 12, and 13 show the portion of the underfill 16 which encapsulates the peripheral portion of the chip 14, but does not show a portion 56 of the underfill 16 that is directly under the chip 14.

The following discussion presents three embodiment classes of the present invention. The first embodiment class is illustrated by FIGS. 1-5 and 11. The second embodiment class is illustrated by FIGS. 1, 6–8, and 12. The third embodiment class is illustrated by FIGS. 1, 9–10, and 13.

Figure 2:
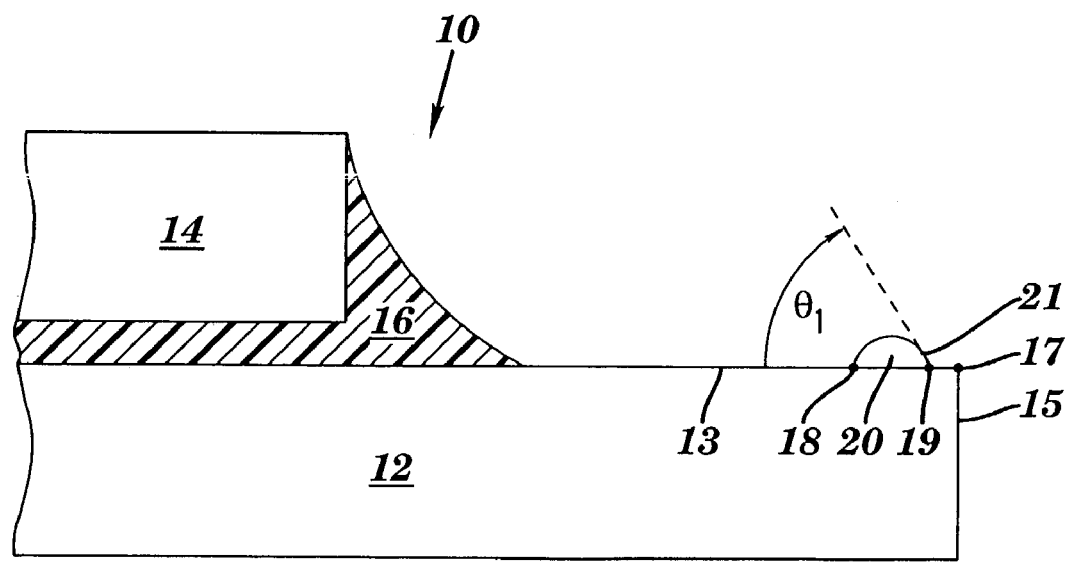
FIG. 2 depicts FIG. 1 after a dam of a first adhesive material has been dispensed on a peripheral portion of the substrate.

FIGS. 1–5 and 11 illustrate a first embodiment class of the present invention. FIG. 2 illustrates FIG. 1 after a dam 20 of a first adhesive material that has been dispensed on the surface 13 of the substrate 12. As dispensed, the first adhesive material is uncured. The first adhesive material may comprise, inter alia, a first epoxy material that includes a first thixotrope at a thixotropic concentration such that the first adhesive material remains in place upon being dispensed. The dam 20 has an outer surface 21 that meets the substrate 12 in a planar area bounded by an inner contact curve 18 and an outer contact curve 19. See FIG. 11, described infra, for a top view depicting the dam 20, the inner contact curve 18, and the outer contact curve 19. Although the dam 20 may be dispensed at any desired location on the surface 13 of the substrate 12, it may be advantageous to place the dam 20 beyond any electrical circuitry or other valuable structure in the substrate 12 in order to minimize potential damage to electrical circuitry or other valuable structure in the substrate 12, as will be discussed infra. The dam 20 will constitute a dam portion of a fillet 27 that is depicted infra in FIG. 5.

Returning to FIG. 2, the outer surface 21 of the dam 20 makes a contact angle $\theta_1$ with the outer contact curve 19. $\theta_1$ is approximately constant along the outer contact curve 19 and $\theta_{1AVE}$ denotes an average value of value of $\theta_1$; i.e., an average contact angle along the outer contact curve 19. Test results, which will be discussed infra, show small standard deviations in the contact angle of 5% to 7% of the average contact angle, which supports the preceding statement that $\theta_1$ is approximately constant along the outer contact curve 19.

Figure 3:
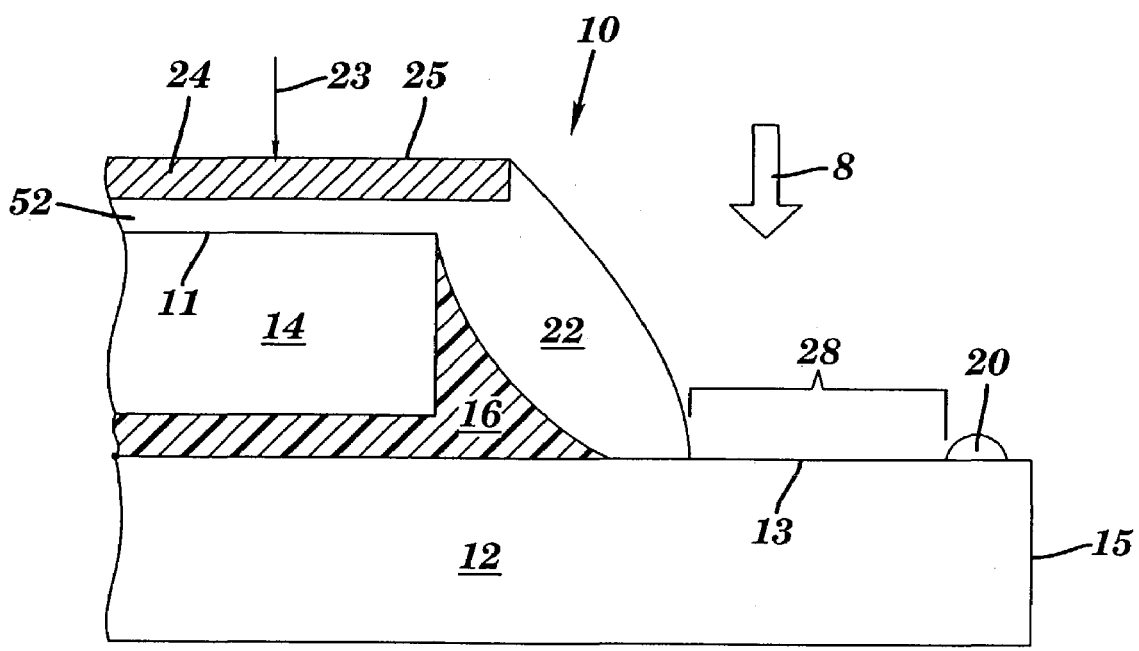
FIG. 3 depicts FIG. 2 after an inner bead of a second adhesive material has been dispensed on a top surface of the chip and around a periphery of the chip, and after a thermally conductive member has been placed on the second adhesive material and over the top surface of the chip, resulting in a first gap disposed between the inner bead and the dam.

FIG. 3 illustrates FIG. 2 after an inner bead 22 of a second adhesive material has been dispensed on top surface 11 of the chip 14 and around a periphery of the chip, resulting in a gap 28 disposed between the inner bead 22 and the dam 20. As dispensed, the second adhesive material is uncured. The second adhesive material may comprise, inter alia, a second epoxy material that includes a second thixotrope at a thixotropic concentration such that the second adhesive material remains in place upon being dispensed. The second adhesive material may be chosen to be the same as, or to differ from, the first adhesive material. The second adhesive material may differ from the first adhesive material with respect to one or more of: the epoxy material, the thixotrope, and the thixotropic concentration. The inner bead 22 will constitute an inner bead portion of the fillet 27 that is depicted infra in FIG. 5. Note that the second adhesive material of the inner bead 22 may be dispensed either before or after the first adhesive material of the dam 20 has been dispensed.

FIG. 3 also illustrates a thermally conductive member 24 (e.g., a heat spreader) placed on the inner bead 22 and above the top surface 11 of the chip 14. See FIG. 11, described infra, for a top view depicting the inner bead 22 and the thermally conductive member 24. Note the FIG. 11 does not show a portion 52 of the inner bead 22 that is directly above the chip 14, and disposed between the chip 14 and the thermally conductive member 24.

Figure 4:
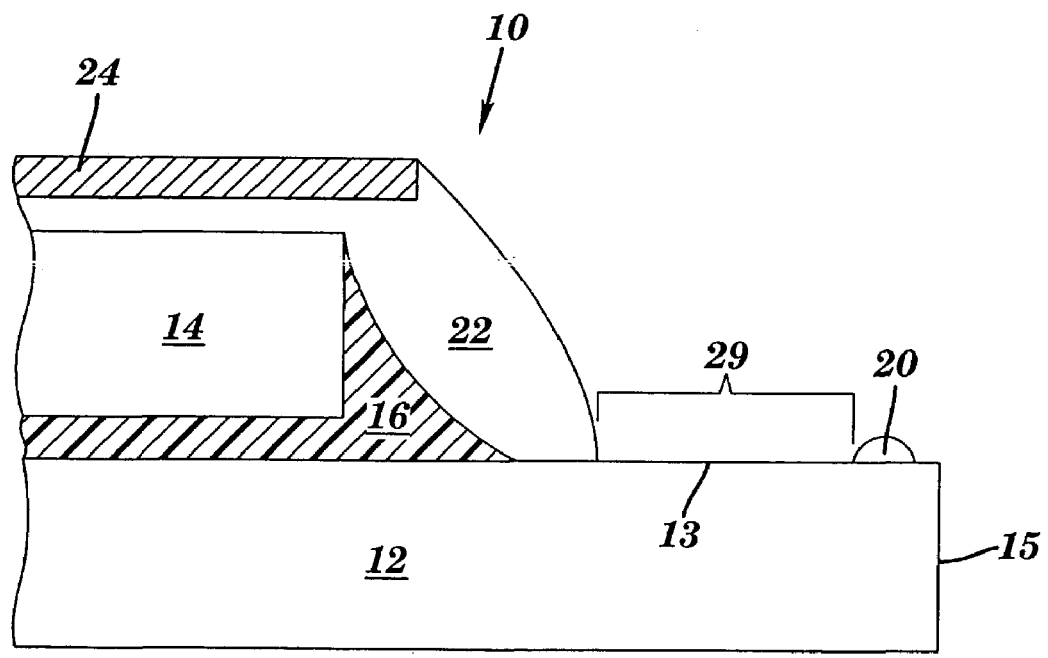
FIG. 4 depicts FIG. 3 after a force has been applied to the thermally conductive member, resulting in a redistribution of the second adhesive material such that a second gap replaces the first gap.

Returning to FIG. 3, a force 23 is applied to the thermally conductive member 24 in a direction 8 toward the chip 14. The force 23 causes the second adhesive material of the inner bead 22 to be redistributed. FIG. 4 illustrates FIG. 3 after the force 23 has been applied to the thermally conductive member 24, resulting in a second gap 29 that replaces the first gap 28.

Figure 5:
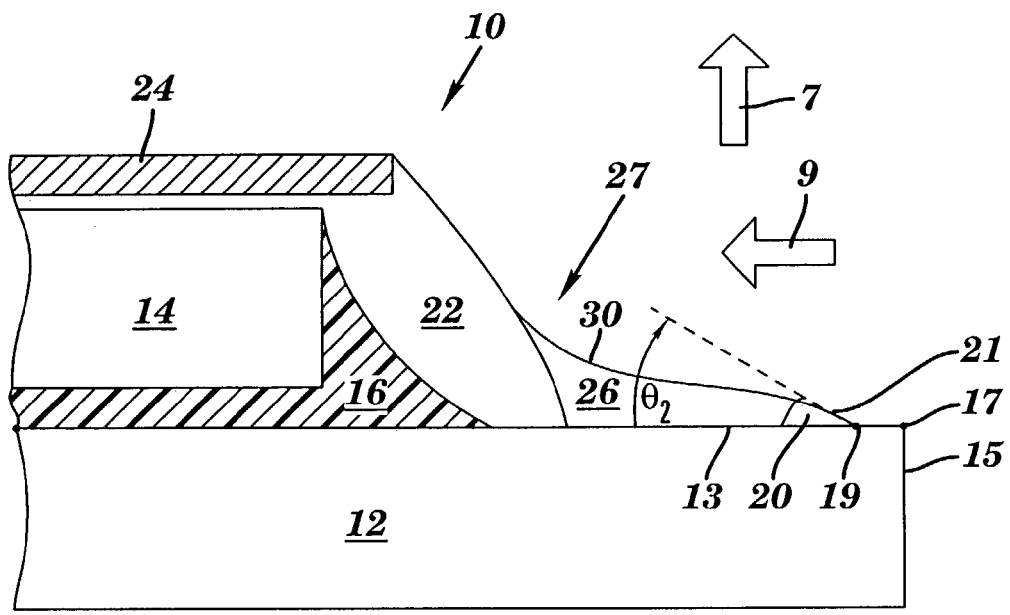
FIG. 5 depicts FIG. 4 after the second gap has been filled with a third adhesive material.

FIG. 5 illustrates FIG. 4 after the second gap 29 has been filled with a third adhesive material 26. See FIG. 11 for a top view of the electronic structure 10 of FIG. 5, including the third adhesive material 26. As dispensed, the third adhesive material 26 is uncured. The third adhesive material 26 may comprise, inter alia, a third epoxy material that includes a third thixotrope at a thixotropic concentration such that the third adhesive material 26 flows upon being dispensed into the second gap 29. The third adhesive material 26 differs from both the first adhesive material and the second adhesive material with respect to one or more of: the epoxy material, the thixotrope, and the thixotropic concentration. If the third adhesive material 26 includes the same epoxy material and thixotrope as the first adhesive material and/or the second adhesive material, then the third adhesive material 26 must have a lower thixotropic concentration than the thixotropic concentration of the first adhesive material and/or the second adhesive material. Allowable ranges of thixotropic concentration are case dependent and vary with the epoxy material and the thixotrope used. For a variety of epoxy materials and thixotropes, a representative thixotropic concentration of the third adhesive material 26 is less than about 1.5% by weight, and a representative thixotropic concentration of the first and/or second adhesive material 26 is greater than about 1.5% by weight.

While the discussion supra associated with FIGS. 3–5 disclosed applying the force 23 (see FIG. 3) to the thermally conductive member 24 prior to filling the second gap 29 with the third adhesive material 26 (see FIGS. 4–5), the preceding steps could be reversed as follows. The first gap 28 (see FIG. 3) could first be filled with the third adhesive material 26, followed by applying the force 23 to the thermally conductive member 24 which would redistribute the second adhesive material of the inner bead 22. Regardless of whether the force 23 is applied to the thermally conductive member 24 before or after filling the second gap 29 (or the first gap 28) with the third adhesive material 26, the structure in FIG. 5 relating to the third adhesive material 26 will result.

After being dispensed, the third adhesive material 26, flows and takes a shape that conforms to boundaries imposed by the inner bead 22 and the dam 20. The third adhesive material 26 constitutes an extended fillet portion of the fillet 27. Thus, the fillet 27 includes the inner bead portion (i.e., the inner bead 22), the extended fillet portion (i.e., the third adhesive material 26), and the dam portion (i.e., the dam 20). After being dispensed, the third adhesive material 26 interacts with the first adhesive material of the dam 20 in a manner that reduces the contact angle with the outer contact curve 19 to a lower value $\theta_2$ in comparison with $\theta_1$ (see FIG. 2). If $\theta_{2AVE}$ denotes an average value of $\theta_2$ around the outer contact curve 19 (see FIG. 11), then $\theta_2 < \theta_1$ and thus $\theta_{2AVE} < \theta_{1AVE}$.

Figure 14:
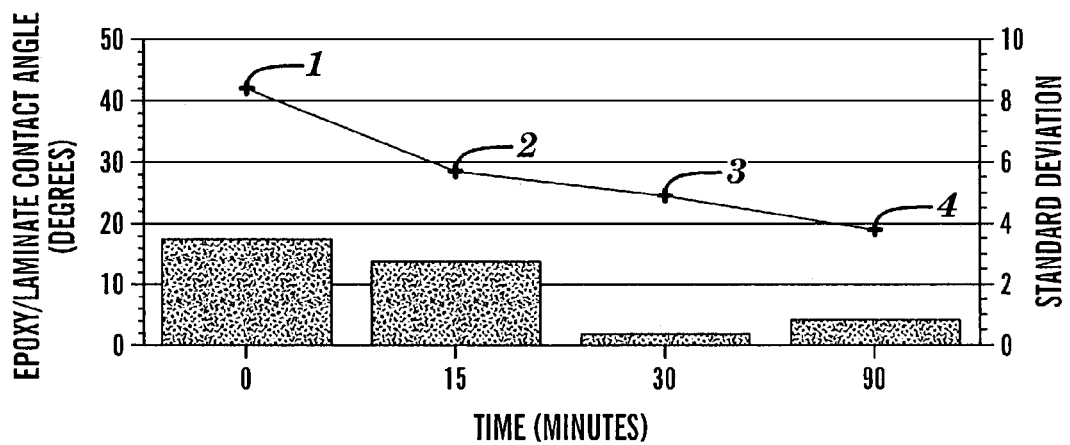
FIG. 14 presents test results which show a reduction in contact angle that the dam of FIG. 5 makes with the substrate after the second gap has been filled with the third adhesive material.

FIG. 14 presents test results which show the contact angle (as exemplified by $\theta_1$ of FIG. 2 and $\theta_2$ of FIG. 5) as a function of time for four data points 1, 2, 3, and 4. The indicated standard deviation (STD) corresponds to averaging over four contact angles at each of the data points 1, 2, 3, and 4. The four angles for averaging purposes correspond to four spatial points on the outer contact curve 19 of FIG. 1. The data point 1 represents an initial condition at ambient room temperature (i.e., about 21° C.) at which the inner bead 22 and the dam 20, but not the third adhesive material 26 of FIG. 5, are on the substrate 12. An initial contact angle $\theta_1$ is 41±3 degrees (i.e, the average contact angle $\theta_{1AVE}$ is 41 degrees subject to a standard deviation of 3 degrees). After the initial condition, the third adhesive material 26 is dispensed. The data point 2 occurs at ambient room temperature and 15 minutes after the third adhesive material 26 has been dispensed during which the contact angle has been reduced to 29±3 degrees. The data point 3 occurs at ambient room temperature and 30 minutes after the third adhesive material 26 has been dispensed during which time the contact angle has been reduced to 25±1 degrees. At about 60 minutes after the third adhesive material 26 had been dispensed, the electronic structure 10 was placed in a heated chamber at 130° C. for curing and was removed for final measurement of the contact angle $\theta_2$ at about 30 minutes after being placed in the heated chamber. Accordingly, the data point 4 occurs after a total exposure of 60 minutes to the ambient room temperature and an additional exposure of 30 minutes to a temperature of 130° C. The final measured contact angle $\theta_2$ associated with the data point 4 is 20±1 degrees. Thus, an unknown portion of the final 5 degree contact angle reduction from the data point 3 to the data point 4 occurs at ambient room temperature, and a remaining unknown portion of the final 5 degree contact angle reduction occurs at 130° C. Note that the standard deviation for the data points 1, 2, 3, and 4 is only 5% to 7% of the average contact angle, which shows that the contact angle is approximately constant on the outer contact curve 19 of FIG. 11.

The aforementioned test results show a total reduction in average contact angle of a factor of about 2 (i.e., from 41 degrees to 20 degrees), and a reduction in average contact angle of at least 1.6 (i.e., from 41 degrees to 25 degrees) during temperature exposure to only ambient room temperature. The reduction of the contact angle to 25 degrees or less (which is a satisfactory low contact angle) during temperature exposure to only ambient room temperature allows for pre-cure inspection of the contact angle, which enables parts having unacceptable contact angles to be discarded or reworked without incurring the cost and time of curing.

Returning to FIG. 5, the contact angle reduction from $\theta_1$ to $\theta_2$ is caused by surface tension between the third adhesive material 26 and the first adhesive material of the dam 20. In particular, the aforementioned surface tension generates a force which pulls the first adhesive material at the surface 21 of the dam 20 toward the third adhesive material 26 in a direction 9 which results in the contact angle reduction from $\theta_1$ to $\theta_2$.

After the third adhesive material 26 has been dispensed, the first adhesive material, the second adhesive material, and the third adhesive material 26 are cured at an elevated temperature. The elevated temperature is application dependent and is a function of the first adhesive material, the second adhesive material, and the third adhesive material 26. The time for substantial completion of curing is a decreasing function of the cure temperature. A representative cure temperature and cure time is 130° C. for 4 hours. A cure temperature and associated cure time suitable for the intended application may be determined empirically without undue experimentation by one of ordinary skill in the art. As shown supra in the test results of FIG. 14, the contact angle reduction to 25 degrees or less takes place before curing.

The aforementioned contact angle reduction to about 20–25 degrees or less for $\theta_2$ and $\theta_{2AVE}$ substantially prevents cracks from forming during thermal cycling on the surface 13 of the substrate 12 in a vicinity of the planar area bounded by the inner contact curve 18 and the outer contact curve 19 (see FIG. 11). The following table summarizes test results showing a percentage of parts that have developed one or more cracks as a function of the average contact angle that an outer surface of a fillet makes with a substrate surface.

| Average Contact Angle (Degrees) | Parts With Cracks (%) | | |
| --- | --- | --- | --- |
| | At 310 Cycles | At 675 Cycles | At 1053 Cycles |
| 48 | 19 | 50 | 75 |
| 38 | 6 | 50 | 63 |
| 29 | 6 | 31 | 69 |
| 26 | 6 | 25 | 25 |
| 18 | 0 | 0 | 13 |

In the above table, 16 parts were tested at each contact angle in a wet thermal shock test having a temperature range of −55° C. to 125° C. in each cycle. The test results indicate that 63–75% of parts had crack formation during 1053 thermal cycles if the average contact angle $\theta_2$ was 29 degrees or more. In contrast, only 13–25% of parts had crack formation during 1053 thermal cycles if the average contact angle was 26 degrees or less.

Returning to FIG. 5, for thermal stress on the surface 13 induced during thermal cycling, crack formation is caused by a geometric stress concentration. The stress concentration at the outer contact curve 19 is a monotonically increasing function of the contact angle $\theta_2$, because as $\theta_2$ increases, the height in the direction 7 of the third adhesive material 26 at the outer contact curve 19 increases, resulting in a corresponding increase in stiffness imposed on the substrate at the outer contact curve 19. In the limit of $\theta_2$ approaching zero degrees, the discontinuity in stress concentration across the outer contact curve 19 from inside the dam 20 to outside the dam 20 vanishes. Thus below a threshold contact angle $\theta_2$, the stress concentration is sufficiently low to render crack formation unlikely. Based on the test data presented supra, the threshold contact angle $\theta_2$ is about 25 degrees.

The actual values of $\theta_2$ which may be obtained with the embodiment of the present invention, as described by FIGS. 1–5 and 11, are case dependent and depend on the geometry of the third adhesive material 26 in relation to the geometry of the inner bead 22 and the dam 20. For example, in order to effectuate a low contact angle, such as $\theta_2$, less than about 25 degrees, an exposed surface 30 of the third adhesive material 26 must be concave upward; i.e., concave in a direction 7. Whether the exposed surface 30 is concave upward depends on the relative heights (in the direction 7) of the third adhesive material 26, the inner bead 22, and the dam 20. Accordingly, $\theta_2$ may be controlled or influenced by adjusting the volume of the third adhesive material 26 for a given size of the gap 29 (see FIG. 4) in consideration of the heights of the inner bead 22 and the dam 20. Whether the exposed surface 30 is concave upward also depends on the width (in the direction 9) of the third adhesive material 26, which may be adjusted by where the dam 20 is placed on the surface 13 of the substrate 12. In consideration of the preceding variables in relation to the aforementioned case-dependent determination of $\theta_2$, one skilled in the art may determine, without undue experimentation, how to use the present invention to obtain desired contact angles $\theta_2$.

The present invention, as embodied in FIGS. 1–5 and 11 may protect electrical circuitry or other valuable structure in the substrate 12 in either or both of two ways. A first way of accomplishing said protecting is by locating the dam 20 at specific locations on the surface 13 above or near electrical circuitry or other valuable structure in the substrate 12 needing protection, such that the contact angle $\theta_2$ at the dam 20 is less than about 25 degrees at said specific locations. As stated supra, a contact angle $\theta_2$ of less than about 25 degrees protects the surface 13 against cracking. A second way of accomplishing said protecting is by locating the dam 20 at specific locations on the surface 13 not above or near electrical circuitry or other valuable structure in the substrate 12 needing protection, so that even if cracking at the outer contact curve 19 at the dam 20 should occur, there would be no nearby electrical circuitry or other valuable structure to be damaged. Depending on how electrical circuitry or other valuable structure within the substrate 12 is distributed, the second way of accomplishing said protecting may include, inter alia, positioning the dam 20 such that the outer contact curve 19 is at a distance no greater than a specified distance from the peripheral edge 17 of the substrate 12.

Figure 6:
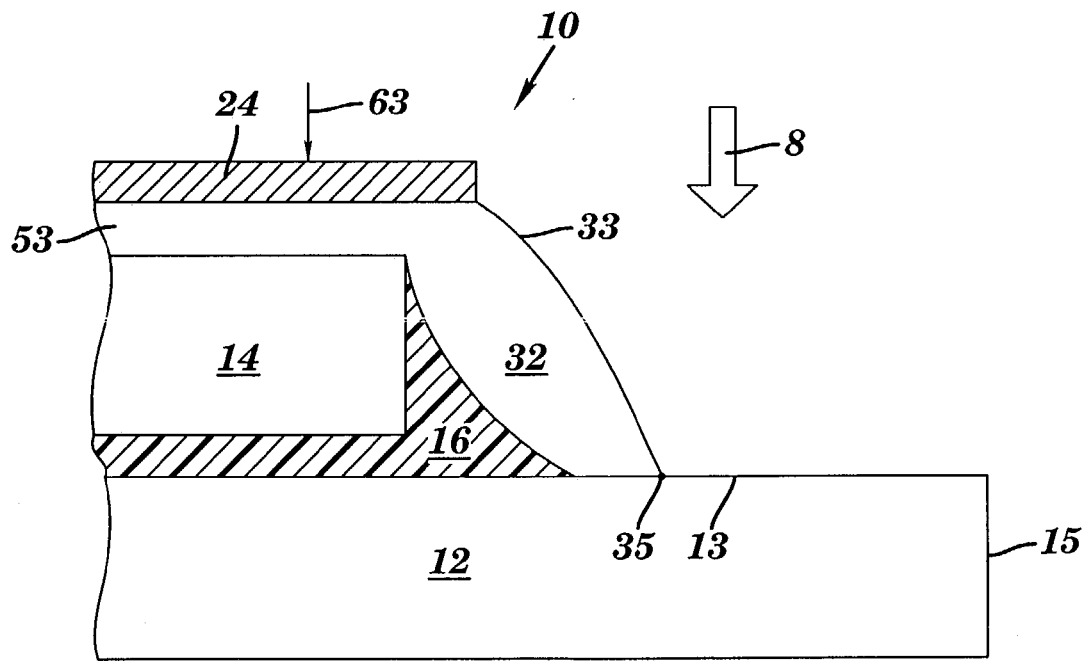
FIG. 6 depicts FIG. 1 after an adhesive material has been dispensed on a top surface of the chip and around a periphery of the chip, and after a thermally conductive member has been placed on the adhesive material and over the top surface of the chip.

FIGS. 1, 6–8, and 12 illustrate a second embodiment class of the present invention. FIG. 6 illustrates FIG. 1 after a bead 32 of an adhesive material has been dispensed on a top surface of the chip 14 and around a periphery of the chip 14, and after a thermally conductive member 24 has been placed on the bead 32 and over the top surface of the chip 14. As dispensed, the adhesive material of the bead 32 is uncured. The adhesive material of the bead 32 may comprise an epoxy material that includes a thixotrope at a low thixotropic concentration (e.g., at a thixotropic concentration of less than about 1.5% by weight for many thixotrope-epoxy combinations) such that the viscosity of the adhesive material of the bead 32 initially decreases upon being heated. The bead 32 has an outer surface 33 that meets the substrate 12 in a planar area bounded by an outer contact curve 35. See FIG. 12 for a top view of the electronic structure 10 of FIG. 6 depicting the bead 32, the thermally conductive member 24, and the outer contact curve 35. Note the FIG. 12 does not show a portion 53 of the bead 32 that is directly above the chip 14, and disposed between the chip 14 and the thermally conductive member 24.

Figure 7:
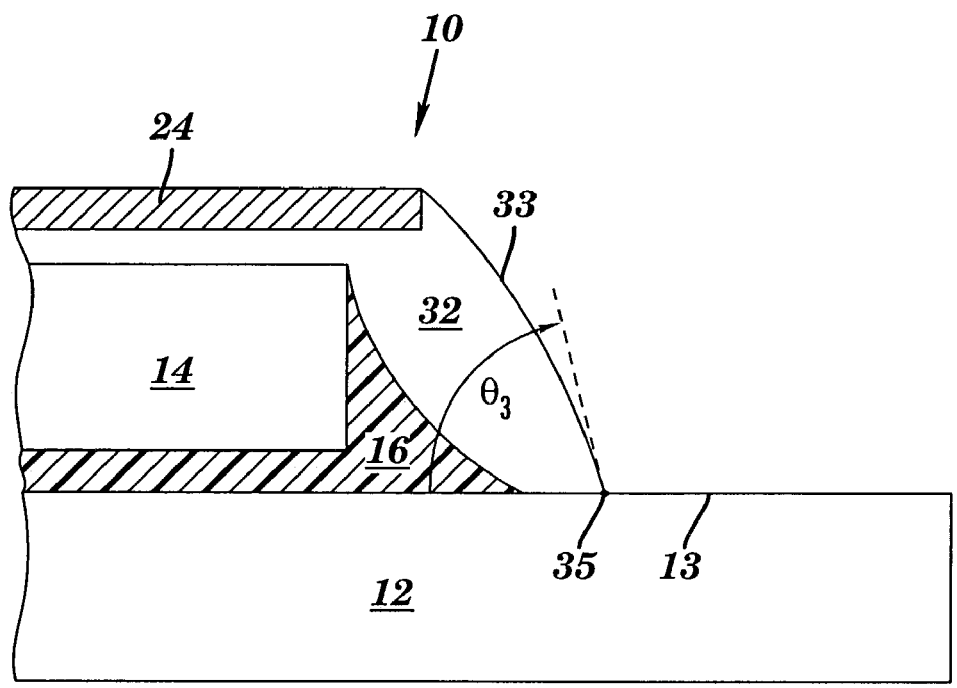
FIG. 7 depicts FIG. 6 after a force has been applied to the thermally conductive member in a direction toward the top surface of the chip resulting in a redistribution of the adhesive material.
Figure 8:
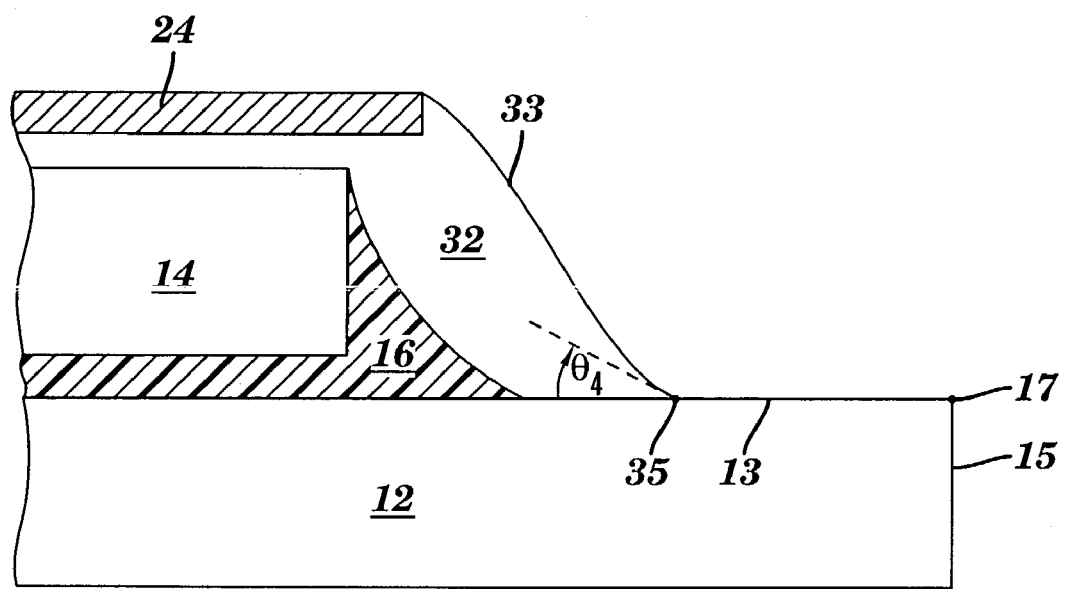
FIG. 8 depicts FIG. 7 after the adhesive material has been cured at an elevated temperature.

Returning to FIG. 6, a force 63 is applied to the thermally conductive member 24 in the direction 8 toward the chip 14. The force 63 causes the adhesive material of the bead 32 to be redistributed. FIG. 7 illustrates FIG. 6 after the force 63 has been applied to the thermally conductive member 24. FIG. 7 shows the outer surface 33 of the bead 32 making a contact angle $\theta_3$ with the surface 13 of the substrate 12. The outer contact curve 35 of the bead 32 may be sufficiently close to the chip 14 so that the contact angle $\theta_3$ is rather steep such as about 45° or more. $\theta_3$ is approximately constant along the outer contact curve 35. Noting that $\theta_3$ may have minor variations along the contact curve 35, $\theta_{3AVE}$ denotes an average value of value of $\theta_3$; i.e., an average contact angle along the outer contact curve 35.

Next, the adhesive material of the bead 32 is thermally cured at an elevated temperature. The elevated temperature is application dependent and is a function of the adhesive material of the bead 32. The time for substantial completion of curing is a decreasing function of the cure temperature. A cure temperature and associated cure time suitable for the intended application. may be determined empirically without undue experimentation by one of ordinary skill in the art. At the onset of curing (i.e., during an initial time interval at the cure temperature), the viscosity of the adhesive initially decreases before the curing later increases the viscosity of the adhesive. The initial viscosity decrease reduces the contact angle to a value $\theta_4$ that is less than about 25 degrees. Thus, the reduction of the contact angle from $\theta_3$ to $\theta_4$ occurs substantially during the aforementioned curing step. The low value of $\theta_4$ (i.e., less than about 25 degrees) prevents cracks from forming during thermal cycling on the surface 13 of the substrate 12 in a vicinity of the planar area bounded by the outer contact curve 35, as explained supra in conjunction with the analogous contact angle $\theta_2$ of FIG. 5.

Figure 9:
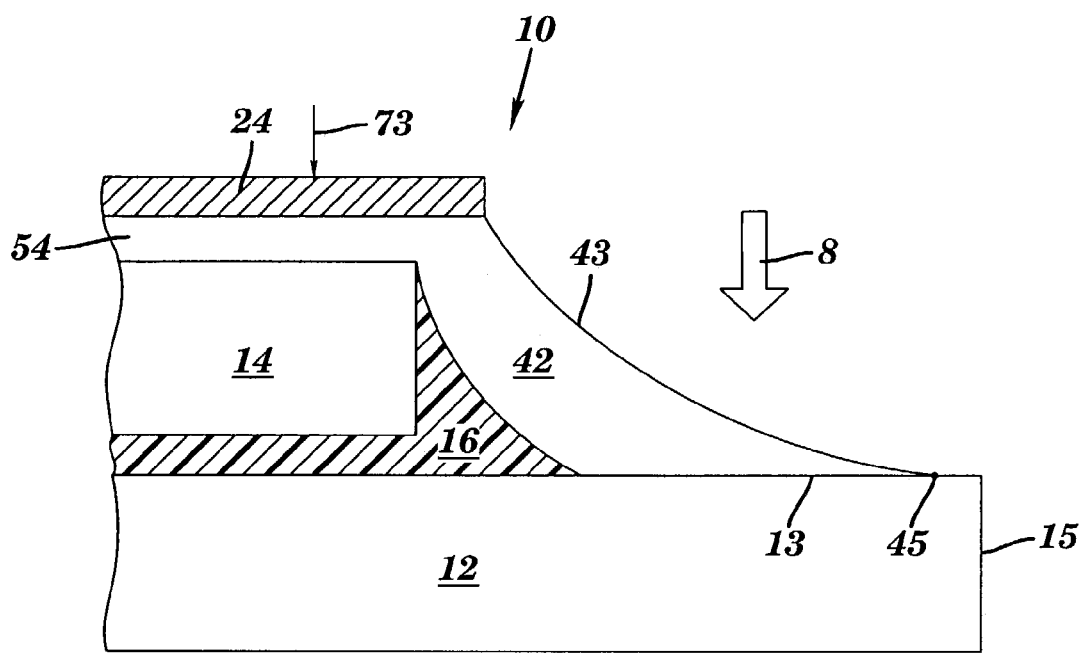
FIG. 9 depicts FIG. 1 after an adhesive material has been dispensed on a top surface of the chip and around a periphery of the chip and extending to a peripheral portion of the substrate, and after a thermally conductive member has been placed on the adhesive material and over the top surface of the chip.

FIGS. 1, 9–10, and 13 illustrate a third embodiment class of the present invention. FIG. 9 illustrates FIG. 1 after a bead 42 of a high-thixotropic adhesive material (e.g., at a thixotropic concentration of at least about 1.5% by weight for many thixotrope-epoxy combinations) has been dispensed on a top surface of the chip 14 and around a periphery of the chip 14, and after a thermally conductive member 24 has been placed on the bead 42 and over the top surface of the chip 14. As dispensed, the adhesive material of the bead 42 is uncured. The high-thixotropic adhesive material of the bead 42 may comprise the high-thixotropic adhesive material such that the adhesive material remains in place upon being dispensed. The bead 42 has an outer surface 43 that meets the substrate 12 in a planar area bounded by an outer contact curve 45. See FIG. 13 for a top view of the electronic structure 10 of FIG. 9 depicting the bead 42, the thermally conductive member 24, and the outer contact curve 45. Note the FIG. 13 does not show a portion 54 of the bead 42 that is directly above the chip 14, and disposed between the chip 14 and the thermally conductive member 24.

Figure 10:
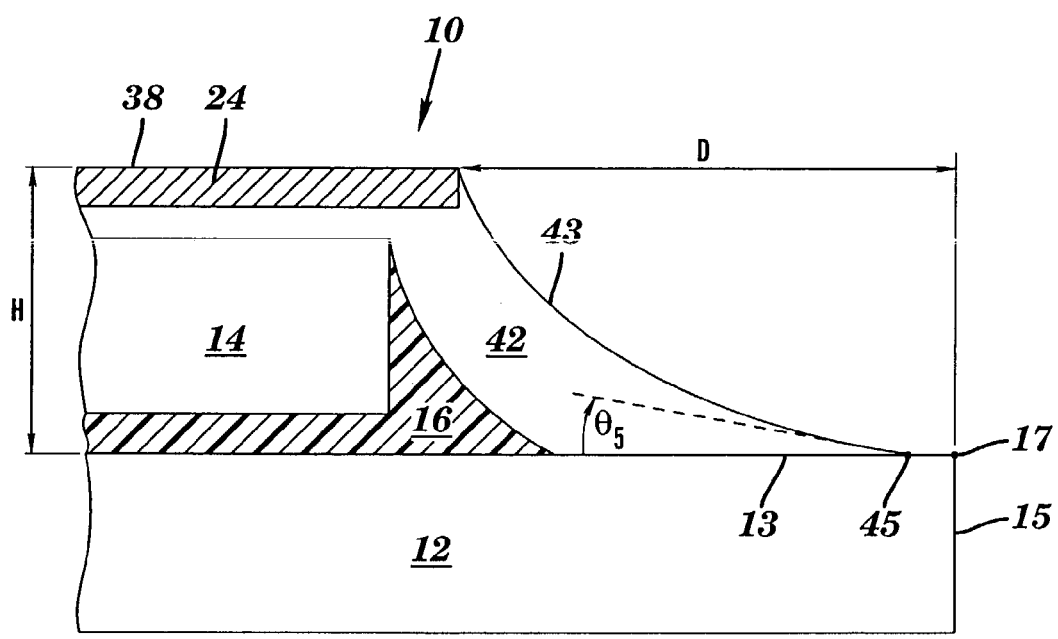
FIG. 10 depicts FIG. 9 after a force has been applied to the thermally conductive member in a direction toward the top surface of the chip resulting in a redistribution of the adhesive material.

Returning to FIG. 9, a force 73 is applied to the thermally conductive member 24 in the direction 8 toward the chip 14. The force 73 causes the adhesive material of the bead 42 to be redistributed. FIG. 10 illustrates FIG. 9 after the force 73 has been applied to the thermally conductive member 24, after which an outer surface 43 of the bead 42 makes a contact angle $\theta_5$ with the surface 13 of the substrate 12.

The bead 42 is positioned on the surface 13 of the substrate 12 in a manner that results in the contact angle $\theta_5$ having a value of about 25 degrees or less. Such positioning of the bead 42 requires that a height H of a surface 38 of the thermally conductive member 24 above the surface 13 of the substrate 12 be sufficiently small in relation to a lateral distance D between the the thermally conductive member 24 and the outer contact curve 45. An exact relation between H and D to keep the contact angle $\theta_5$ to about 25 degrees or less is application dependent and depends on the high-thixotropic adhesive material of the bead 42. For a given lateral distance D of about 100 mils, a representative height H is about 42 mils. A suitable relation between H and D for the intended application may be determined empirically without undue experimentation by one of ordinary skill in the art.

Noting that $\theta_5$ has minor variations along the contact curve 45, $\theta_{5AVE}$ denotes an average value of value of $\theta_5$; i.e., an average contact angle along the outer contact curve 45. The aforementioned low value of $\theta_5$ prevents cracks from forming during thermal cycling on the surface 13 of the substrate 12 in a vicinity of the planar area bounded by the outer contact curve 45, as explained supra in conjunction with the analogous contact angle $\theta_2$ of FIG. 5.

Next, the high-thixotropic adhesive material of the bead 42 is cured at an elevated temperature. The elevated temperature is application dependent and is a function of the high-thixotropic adhesive material of the bead 42. The time for substantial completion of curing is a decreasing function of the cure temperature. A representative cure temperature and cure time is 130° C. for 4 hours. A cure temperature and associated cure time suitable for the intended application may be determined empirically without undue experimentation by one of ordinary skill in the art. The curing does not change the contact angle $\theta_5$.

The present invention discloses a method for farming an electronic structure, comprising the steps of:

providing a substrate, a chip on a surface of the substrate and coupled to the substrato, and a thermally conductive member;

a fillet of at least one adhesive material on the chip and around a periphery of the chip and placing the thermally conductive member on a portion of the fillet and over a top surface of the chip, wherein the at least one adhesive material is uncured, wherein the fillet couples the thermally conductive member to the substrate, and wherein an outer surface of the fillet meets the surface of the substrate at a contact curve and makes an average contact angle $\theta_{1AVE}$ with the surface of the substrate, and wherein each point on the contact curve is not above electrical circuitry or other valuable structure within the substrate; and curing the at least one adhesive material after which the outer surface of the fillet makes un average contact angle $\theta_{2AVE}$ with the surface of the substrate.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming an electronic structure, comprising the steps of:

providing a substrate, a chip on a surface of the substrate and coupled to the substrate, and a thermally conductive member;

forming a fillet of at least one adhesive material on the chip and around a periphery of the chip and placing the thermally conductive member on a portion of the fillet and over a top surface of the chip, wherein the at least one adhesive material is uncured, wherein the fillet couples the thermally conductive member to the substrate, wherein an outer surface of the fillet meets the surface of the substrate at a contact curve and makes an average contact angle $\theta_{1AVE}$ with the surface of the substrate upon initial formation of the fillet during the forming step, and wherein the at least one adhesive material comprises a thixotrope;

applying a force to the thermally conductive member in a direction toward the top surface of the chip resulting in a redistribution of the at least one adhesive material; and after the step of applying the force to the thermally conductive member, curing the at least one adhesive material wherein $\theta_{2AVE}$ represents an average contact angle that the fillet makes with the surface of the substrate after the curing step, wherein $\theta_{2AVE}<\theta_{1AVE}$, and wherein the reduction from $\theta_{1AVE}$ to $\theta_{2AVE}$ occurs between the initial formation of the fillet during the forming step and completion of the curing step such that the reduction from $\theta_{1AVE}$ to $\theta_{2AVE}$ occurs substantially during a contact angle reduction step selected from the group consisting of the forming step, the applying step, and the curing step.

2. The method of claim 1, wherein the reduction from $\theta_{1AVE}$ to $\theta_{2AVE}$ occurs substantially during the forming step, and wherein the forming step comprises:

dispensing a first adhesive material on a peripheral portion of the substrate to form a dam portion of the fillet, wherein the first adhesive material includes a first thixotrope, wherein the dam portion remains in place as it is formed upon the first adhesive material being dispensed, and wherein the outer surface of the fillet includes an outer surface of the dam portion such that the outer surface of the dam portion meets the surface of the substrate at the contact curve and makes the average contact angle $\theta_{1AVE}$ with surface of the substrate, and wherein $\theta_{1AVE}<\theta_{1AVE}$;

dispensing a second adhesive material on the top surface of the chip and around a periphery of the chip to form an inner bead portion of the fillet, wherein the second adhesive material includes a second thixotrope, wherein the inner bead portion remains in place as it is formed upon the second adhesive material being dispensed, and wherein a gap is disposed between the inner bead portion and the dam portion; and filling the gap with a third adhesive material to form an extended fillet portion of the adhesive material fillet, wherein the third adhesive material includes a third thixotrope, wherein the extended fillet portion flows upon the third adhesive material being dispensed such that the extended fillet portion acquires a shape conforming to boundaries imposed by the inner bead portion and the dam portion, and wherein the at least one adhesive material comprises the first adhesive material, the second adhesive material, and the third adhesive material.

3. The method of claim 2, wherein the applying step is performed after the filling step, and wherein the applying step comprises:

placing the thermally conductive member on the inner bead portion and over the top surface of the chip; and applying the force to the thermally conductive member in the direction toward the top surface of the chip resulting in a redistribution of the inner bead.

4. The method of claim 2, wherein the applying step is performed before the filling step, and wherein the applying step comprises:

placing the thermally conductive member on the inner bead portion and over the top surface of the chip; and applying the force to the thermally conductive member in the direction toward the top surface of the chip resulting in a redistribution of the inner bead.

5. The method of claim 2, wherein the step of dispensing the second adhesive is executed prior to the step of dispensing the first adhesive.

6. The method of claim 2, wherein the step of dispensing the second adhesive is executed after the step of dispensing the first adhesive.

7. The method of claim 2, wherein each point on the contact curve is not above electrical circuitry within the substrate.

8. The method of claim 7, wherein the thixotrope constitutes at least about 1.5% by weight of the single adhesive material.

9. The method of claim 1, wherein the reduction from $\theta_{1AVE}$ to $\theta_{2AVE}$ occurs substantially during the applying step or during the curing step but not during the forming step, wherein the at least one adhesive material comprises a single adhesive material, and wherein the forming step comprises:

dispensing the single adhesive material on the top surface of the chip and around a periphery of the chip to form the fillet, wherein the single adhesive material includes the thixotrope, and wherein the fillet remains in place as it is formed upon being dispensed; and placing the thermally conductive member on the fillet and over the top surface of the chip, wherein the applying step comprises, applying the force to the thermally conductive member in the direction toward the top surface of the chip resulting in a redistribution the single adhesive material of the fillet.

10. The method of claim 9, wherein the reduction from $\theta_{1AVE}$ to $\theta_{2AVE}$ occurs substantially during the curing step.

11. The method of claim 9, wherein the thixotrope constitutes less than about 1.5% by weight of the single adhesive material.

12. The method of claim 9, wherein the reduction from $\theta_{2AVE}$ to $\theta_{1AVE}$ occurs substantially doting the applying step.

13. A method for forming an electronic structure, comprising the steps of:

providing a substrate, a chip on a surface of the substrate and coupled to the substrate, and a thermally conductive member;

forming a fillet of at least one adhesive material on the chip and around a periphery of the chip and placing the thermally conductive member on a portion of the fillet and over a top surface of the chip, wherein the at least one adhesive material is uncured, wherein the fillet couples the thermally conductive member to the substrate, and wherein an outer surface of the fillet meets, the surface of the substrate at a contact curve and makes an average contact angle $\theta_{1AVE}$ with the surface of the substrate upon initial formation of the fillet during the forming step;

applying a force to the thermally conductive member in a direction toward the top surface of the chip resulting in redistribution of the at least one adhesive material; and after the step of applying the force to the thermally conductive member, curing the at least one adhesive material wherein $\theta_{2AVE}$ represents an average contact angle that the fillet makes with the surface of the substrate after the curing step, wherein $\theta_{2AVE} < \theta_{1AVE}$ wherein the reduction from $\theta_{1AVE}$ to $\theta_{2AVE}$ occurs between the initial formation of the fillet during the forming step and completion o C the curing step such that the reduction from $\theta_{1AVE}$ to $\theta_{2AVE}$ occurs substantially during a contact angle reduction step selected from tho group consisting of the forming step, the applying step, and the curing step, and wherein $\theta_{2AVE}$ does not exceed about 25 degrees.

14. The method of claim 13, wherein the reduction from $\theta_{1AVE}$ to $\theta_{2AVE}$ occurs substantially during the forming step, and wherein the forming step comprises:

dispensing a first adhesive material on a peripheral portion of the substrate to form a dam portion of the fillet, wherein the first adhesive material includes a first thixotrope, wherein the dam portion remains in place as it is formed upon the first adhesive material being dispensed, and wherein the outer surface of the fillet includes an outer surface of the dam portion such that the outer surface of the dam portion meets the surface of the substrate at the contact curve and makes the average contact angle $\theta_{1AVE}$ with surface of the substrate dispensing a second adhesive material on the top surface of the chip and around a periphery of the chip to form an inner bead portion of the fillet, wherein the second adhesive material includes a second thixotrope, wherein the inner bead portion remains in place as it is formed upon the second adhesive material being dispensed, and wherein a gap is disposed between the inner bead portion and the dam portion; and filling the gap with a third adhesive material to form an extended fillet portion of the adhesive material fillet, wherein the third adhesive material includes a third thixotrope, wherein the extended fillet portion flows upon the third adhesive material being dispensed such that the extended fillet portion acquires a shape conforming to boundaries imposed by the inner bead portion and the dam portion, and wherein the at least one adhesive material comprises the first adhesive material, the second adhesive material, and the third adhesive material.

15. The method of claim 14, further comprising after the filling step:

placing the thermally conductive member on the inner bead portion and over the top surface of the chip; and applying a force to the thermally conductive member in a direction toward the top surface of the chip resulting in a redistribution of the inner bead.

16. The method of claim 14, further comprising before the filling step:

placing the thermally conductive member on the inner bead portion and over the top surface of the chip; and applying a force to the thermally conductive member in a direction toward the top surface of the chip resulting in a redistribution of the inner bead.

17. The method of claim 14, wherein $\theta_{2AVE}$ is less than $\theta_{1AVE}$ by a factor of at least about 2.

18. The method of claim 14, wherein the first thixotrope and the second thixotrope each constitute at least about 1.5% by weight of the first adhesive material and the second adhesive material, respectively, and wherein the third thixotrope constitutes less than about 1.5% by weight of the third adhesive material.

19. The method of claim 14, wherein the second adhesive material is a same material as the first adhesive material.

20. The method of claim 14, wherein the step of dispensing a second adhesive is executed prior to the step of dispensing a first adhesive.

21. The method of claim 13, wherein the reduction from $\theta_{1AVE}$ to $\theta_{2AVE}$ occurs substantially during the applying step or during the curing step but not during the forming step, wherein the at least one adhesive material comprises a single adhesive material, and wherein the forming step comprises:

dispensing the single adhesive material on the top surface of the chip and around a periphery of the chip to form the fillet, wherein the single adhesive material includes a thixotrope, and wherein the fillet remains in place as it is formed upon being dispensed; and placing the thermally conductive member on the fillet and over the top surface of the chip.

22. The method of claim 21, wherein the reduction from $\theta_{1AVE}$ to $\theta_{2AVE}$ occurs substantially during the curing step.

23. The method of claim 22, wherein the thixotrope constitutes less than about 1.5% by weight of the single adhesive material.

24. The method of claim 21, wherein the reduction from $\theta_{2AVE}$ to $\theta_{1AVE}$ occurs substantially during the applying step.

25. The method of claim 24, wherein the thixotrope constitutes at least about 1.5% by weight of the single adhesive material.

26. The method of claim 13, wherein the substrate includes a chip carrier.

27. A method for forming an electronic structure, comprising the steps of:

providing a substrate, a chip on a surface of the substrate and coupled to the substrate, and a thermally conductive member;

forming a fillet of at least one adhesive material on the chip and around a periphery of the chip and placing the thermally conductive member on a portion of the fillet and over a top surface of the chip, wherein the at least one adhesive material is uncured, wherein the fillet couples the thermally conductive member to the substrate, wherein an outer surface of the fillet meets the surface of the substrate at a contact curve and makes average contact angle $\theta_{1AVE}$ with the surface of the substrate upon initial formation of the fillet during the forming step, and wherein the at least one adhesive material comprises a thixotrope;

applying a force to the thermally conductive member in a direction toward the top surface of the chip resulting redistribution of the at least one adhesive material; and after the step of applying the force to the thermally conductive member, curing the at least one adhesive material wherein $\theta_{2AVE}$ represents an average contact angle that the fillet makes with the surface of the substrate after the curing step, wherein $\theta_{2AVE} < \theta_{1AVE}$, and wherein the reduction from $\theta_{1AVE}$ to $\theta_{2AVE}$ occurs between the initial formation of the fillet during the forming step and completion of the curing step such that the reduction from $\theta_{1AVE}$ to $\theta_{2AVE}$ occurs substantially during a contact angle reduction step selected from the group consisting of the forming step, the applying step, and the curing step, wherein each point on the contact curve is not above electrical circuitry within the substrate.

* * * * *

UNITED STATES PATENT AND TRADEMARK OFFICE
CERTIFICATE OF CORRECTION

PATENT NO.    : 6,984,286 B2
DATED         : January 10, 2006
INVENTOR(S)   : Bonitz et al.

It is certified that error appears in the above-identified patent and that said Letters Patent is hereby corrected as shown below:

Column 5,
Line 4, delete "1." and insert -- 11 --.

Column 6,
Lines 12-14, delete "Average Contact Angle (Degrees)" and insert -- Average Contact Angle (Degrees) --.

Column 9,
Line 5, delete "farming" and insert -- forming --.
Line 8, delete "substrato" and insert -- substrate --.
Line 10, delete "a fillet" and insert -- forming a fillet --.
Line 22, delete "un" and insert -- an --.

Column 10,
Line 11, delete "$\theta_{1AVE} < \theta_{1AVE}$" and insert -- $\theta_{2AVE} < \theta_{1AVE}$ --.

Column 11,
Line 5, delete "comprises," and insert -- comprises --.
Line 15, delete "doting" and insert -- during --.
Line 34, delete "redistribution" and insert -- a redistribution --.
Line 42, delete "o C" and insert -- of --.
Line 45, delete "tho" and insert -- the --.
Line 56, delete "and".

Column 13,
Line 10, delete ", wherein" and insert -- , and wherein --.
Line 11, delete "makes" and insert -- makes an --.

UNITED STATES PATENT AND TRADEMARK OFFICE
CERTIFICATE OF CORRECTION

PATENT NO. : 6,984,286 B2
DATED : January 10, 2006
INVENTOR(S) : Bonitz et al.

It is certified that error appears in the above-identified patent and that said Letters Patent is hereby corrected as shown below:

Column 13 (cont'd),
Line 14, delete "forming step," and insert -- forming step; --.

Signed and Sealed this

Eighteenth Day of April, 2006

JON W. DUDAS
*Director of the United States Patent and Trademark Office*